(12) United States Patent
Tavkhelidze et al.

(10) Patent No.: US 7,074,498 B2
(45) Date of Patent: Jul. 11, 2006

(54) INFLUENCE OF SURFACE GEOMETRY ON METAL PROPERTIES

(75) Inventors: Avto Tavkhelidze, Tbilisi (GE); Stuart Harbron, Berkhamstead (GB)

(73) Assignee: Borealis Technical Limited (GI)

( * ) Notice: Subject to any disclaimer, the term of this patent is extended or adjusted under 35 U.S.C. 154(b) by 0 days.

(21) Appl. No.: 10/508,914

(22) PCT Filed: Mar. 24, 2003

(86) PCT No.: PCT/US03/08907

§ 371 (c)(1),
(2), (4) Date: Sep. 22, 2004

(87) PCT Pub. No.: WO03/083177

PCT Pub. Date: Oct. 9, 2003

(65) Prior Publication Data

US 2005/0147841 A1    Jul. 7, 2005

Related U.S. Application Data (60) Provisional application No. 60/373,508, filed on Apr. 17, 2002, provisional application No. 60/366,564, filed on Mar. 22, 2002, provisional application No. 60/366,563, filed on Mar. 22, 2002.

(51) Int. Cl.
  *C23F 4/00* (2006.01)
  *H01R 3/00* (2006.01)
  *H01L 21/00* (2006.01)

(52) U.S. Cl. ............... 428/687; 29/825; 438/20

(58) Field of Classification Search ........... 438/20; 428/687
See application file for complete search history.

(56) References Cited

U.S. PATENT DOCUMENTS

| | | |
|---|---|---|
| 3,740,592 A | 6/1973 | Engdahl et al. |
| 4,011,582 A | 3/1977 | Cline et al. |
| 4,039,352 A | 8/1977 | Marinescu |
| 4,063,965 A | 12/1977 | Cline et al. |
| 4,686,162 A | 8/1987 | Stangl et al. |
| 5,023,671 A | 6/1991 | DiVincenzo et al. |
| 5,068,535 A | 11/1991 | Rabalais |
| 5,119,151 A | 6/1992 | Onda |
| 5,229,320 A | 7/1993 | Ugajin |
| 5,233,205 A | 8/1993 | Usagawa et al. |
| 5,247,223 A | 9/1993 | Mori et al. |
| 5,332,952 A | 7/1994 | Ugajin et al. |

(Continued)

FOREIGN PATENT DOCUMENTS

JP    4080964 A    3/1992

(Continued)

OTHER PUBLICATIONS

Chou et al., Imprint Lithography with 25 Nanometer Resolution, Science, Apr. 5, 1996, pp. 85-87, vol. 272.

*Primary Examiner*—Evan Pert (57) ABSTRACT

The influence of surface geometry on metal properties is studied within the limit of the quantum theory of free electrons. It is shown that a metal surface can be modified with patterned indents to increase the Fermi energy level inside the metal, leading to decrease in electron work function. This effect would exist in any quantum system comprising fermions inside a potential energy box. Also disclosed is a method for making nanostructured surfaces having perpendicular features with sharp edges.

25 Claims, 8 Drawing Sheets

U.S. PATENT DOCUMENTS

| | | | |
|---|---|---|---|
| 5,336,547 A | 8/1994 | Kawakita et al. | |
| 5,371,388 A | 12/1994 | Oda | |
| 5,432,362 A | 7/1995 | Lippens et al. | |
| 5,503,963 A | 4/1996 | Hifano | |
| 5,521,735 A | 5/1996 | Shimizu et al. | |
| 5,579,232 A | 11/1996 | Tong et al. | |
| 5,604,357 A | 2/1997 | Hori | |
| 5,654,557 A | 8/1997 | Taneya et al. | |
| 5,660,738 A * | 8/1997 | Hunter et al. | 216/17 |
| 5,675,972 A | 10/1997 | Edelson | |
| 5,699,668 A | 12/1997 | Cox | |
| 5,719,407 A | 2/1998 | Ugajin | |
| 5,722,242 A | 3/1998 | Edelson | |
| 5,772,905 A | 6/1998 | Chou | |
| 5,861,707 A * | 1/1999 | Kumar | 313/309 |
| 5,917,156 A | 6/1999 | Nobori et al. | |
| 6,117,344 A | 9/2000 | Cox et al. | |
| 6,214,651 B1 | 4/2001 | Cox | |
| 6,225,205 B1 | 5/2001 | Kinoshita | |
| 6,281,514 B1 | 8/2001 | Tavkhelidze | |
| 6,417,060 B1 | 7/2002 | Tavkhelidze et al. | |
| 6,680,214 B1 * | 1/2004 | Tavkhelidze et al. | 438/20 |
| 6,736,709 B1 * | 5/2004 | James et al. | 451/287 |
| 6,749,485 B1 * | 6/2004 | James et al. | 451/41 |
| 6,875,475 B1 * | 4/2005 | Moran et al. | 427/437 |
| 2001/0046749 A1 | 11/2001 | Tavkhelidze et al. | |
| 2003/0068431 A1 | 4/2003 | Taliashvili et al. | |
| 2003/0121566 A1 * | 7/2003 | Komatsubara et al. | 148/111 |
| 2003/0221608 A1 * | 12/2003 | Mori | 117/2 |
| 2004/0076396 A1 * | 4/2004 | Suga | 385/146 |
| 2004/0156108 A1 * | 8/2004 | Chou et al. | 359/566 |
| 2004/0174596 A1 * | 9/2004 | Umeki | 359/484 |
| 2005/0189545 A1 * | 9/2005 | Tazawa et al. | 257/79 |
| 2005/0243298 A1 * | 11/2005 | de Jager et al. | 355/67 |

FOREIGN PATENT DOCUMENTS

| | | |
|---|---|---|
| WO | WO 99/13562 A1 | 3/1999 |
| WO | WO 99/64642 A1 | 12/1999 |

* cited by examiner

Figure 15

INFLUENCE OF SURFACE GEOMETRY ON METAL PROPERTIES

This application is the U.S. national stage application of International Application PCT/US03/08907, filed Mar. 24, 2003, which international application was published on Oct. 9, 2003, as International Publication WO03083177 in the English language. The International Application claims the benefit of U.S. Provisional Application No. 60/366,563, filed Mar. 22, 2002, U.S. Provisional Application No. 60/366,564, filed Mar. 22, 2002, and U.S. Provisional Application No. 60/373,508, filed Apr. 17, 2002. The International Application is related to co-pending U.S. Patent Application No. 10/234,498, filed 3 Sep. 2002, which claims the benefit of U.S. Provisional Application No. 60/316,918, filed 2 Sep. 2001. The above-mentioned patent applications are assigned to the assignee of the present application and are herein incorporated in their entirety by reference.

TECHNICAL FIELD

The present invention is concerned with methods for increasing the Fermi level of a metal and for promoting the transfer of elementary particles across a potential energy barrier. The present invention also relates to making a surface having a geometric pattern for nanoelectronics applications, and more particularly, to making a surface having a geometric pattern that creates a wave interference pattern that facilitates the emission of electrons from the surface.

BACKGROUND ART

Surfaces having geometric patterns are used in a variety of applications. Generally, a laser, chemical, or other means etches geometric patterns on a surface of solid materials, such as silicon, metal, and the like, for example, as described in U.S. Pat. No. 5,888,846. Geometric patterns may be used for creating optical disk storage systems, semi-conductor chips, and photo mask manufacturing, as described in U.S. Pat. No. 5,503,963. Surfaces capable of enhancing the passage of electrons through a potential energy barrier on the border between a solid body and a vacuum, such as those described in U.S. Pat. Nos. 6,281,514 and 6,117,344, should have patterns of the dimensions of 5–10 nm.

Recent development of such technologies as electron beam milling and ion beam lithography enable the fabrication of structures with dimension as small as a few nanometers. Those low dimensions are comparable with the de Broglie wavelength of a free electron inside the metal. Because of this, it has become possible to fabricate some microelectronic devices working from the wave properties of the electrons [N. Tsukada, A. D. Wieck, and K. Ploog "Proposal of Novel Electron Wave Coupled Devices" Appl. Phys. Lett. 56 (25), p. 2527, (1990); D. V. Averin and K. K. Likharev, in *Mesoscopic in Solids*, edited by B. L. Al'tshuler, P. A. Webb (Elsevier, Amsterdam, 1991)].

Figure 1:
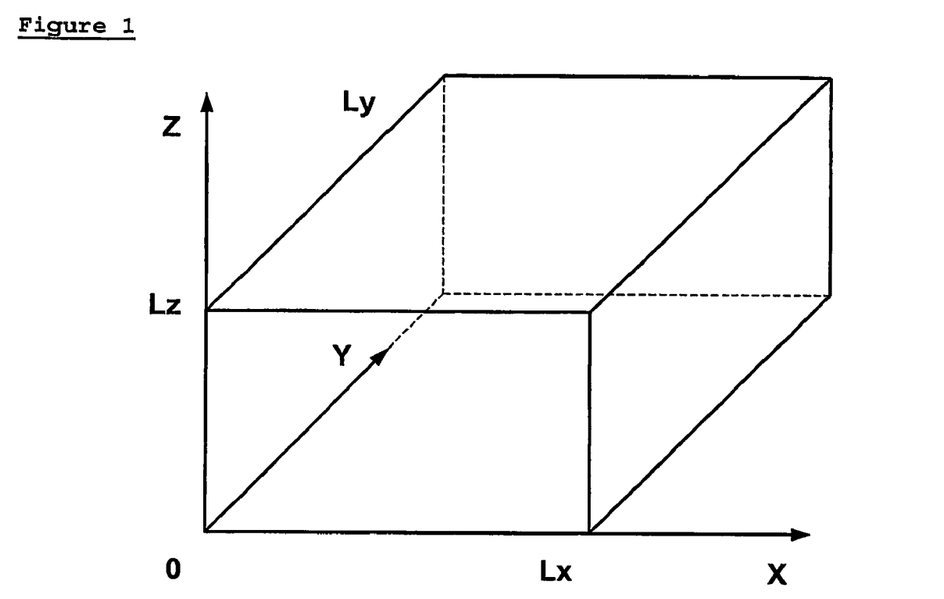
FIG. 1 is a diagrammatic representation of a three-dimensional potential energy box. Potential energy is zero everywhere inside the box volume and is infinity everywhere outside of box volume.

The general case of an elementary particle in the potential energy box is depicted in FIG. 1. The behavior of a particle in the ordinary potential energy box (OPEB) is well known. The Schroedinger equation for particle wave function inside the OPEB has form [L. D. Landau and E. M. Lifshits "Quantum Mechanics" (Russian), Moscow 1963.]:

$$d^2\psi/dx^2 + (8\pi^2 m/h^2)E\psi = 0 \qquad (1)$$

Here $\psi$ is the wave function of the particle, m is the mass of the particle, h is Planck's constant, and E is the energy of the particle. Equation (1) is written for the one dimensional case. General solution of (1) is given in the form of two plane waves moving in directions X and −X.

$$\psi(x) = A\exp(ikx) + B\exp(-ikx) \qquad (2)$$

here A and B are constants and k is the wave vector $$k = [(2mE)^{1/2}]/(h/2\pi) \qquad (3)$$

It is well known that in the case of $U=\infty$, the solution for equation (1) is defined by the boundary condition $\psi=0$ outside the OPEB as follows:

$$\psi = C \sin(kx) \qquad (4)$$

Here C is a constant. If the width of the OPEB is L, then the boundary conditions $\psi(0)=0$ and $\psi(L)=0$ will give the solution to Schroedinger's equation in the form of $\sin(kL)=0$, and $kL=n\pi$ (n=1, 2, 3, . . . ). This gives a well-known discrete series of possible wave vectors corresponding to possible quantum states $$k_n = n\pi/L \qquad (5)$$

and according to (3) discrete series of possible energies $E_n = n^2(h^2/8 \, mL^2)$ A disadvantage of e-beam or ion beam milling is that the distribution of intensity inside the beam is not uniform, which means that structures produced using these methods do not have a uniform shape. In particular, the edges of the milled areas are always rounded, repeating the shape of intensity distribution inside the beam. Such rounding is more or less acceptable depending on the type of device fabricated. However, for devices working on the basis of wave interference this type of rounding is less acceptable, because wave interference depends greatly both on the dimensions and the shape of the structure.

DISCLOSURE OF INVENTION

In broad terms, the present invention is concerned with methods for increasing the Fermi level of a metal.

In accordance with one embodiment of the present invention, a wall of a potential energy box is modified, which changes the boundary conditions for the wave function of an elementary particle inside the potential energy box. New boundary conditions decrease the number of solutions of Schroedinger's equation.

In accordance with a second embodiment of the present invention, a method for increasing the Fermi energy in a metal is disclosed. The method comprises creating an indented or protruded structure on the surface of a metal. The depth of the indents or height of protrusions is equal to a, and the thickness of the metal is Lx+a. The minimum value for a is chosen to be greater than the surface roughness of the metal. Preferably the value of a is chosen to be equal to or less than Lx/5. The width of the indentations or protrusions is chosen to be at least 2 times the value of a.

In accordance with a third embodiment of the present invention, a method for making a surface having a geometric pattern that promotes the emission and transmission of electrons across a surface potential energy barrier is provided. The method includes depositing a metal layer on a substrate. The method also includes exposing specific areas of the metal layer to an electromagnetic energy source and to remove the metal layer in a geometric pattern. The method also includes etching the exposed geometric pattern to form indents in the surface, using a liquid etchant or plasma. The method also includes removing the remaining metal layer from the surface. The method also includes creating De Broglie wave interference with the geometric pattern in the surface. The method also includes removing the metal layer from the surface.

A technical advantage of the present invention is that the method yields a geometric pattern having sharply-defined edges. A further technical advantage of the present invention is that it promotes the transfer of electrons across a potential barrier, and for a particular energy barrier that exists on the border between a solid body and a vacuum, provides a surface with a sharply defined geometric pattern that causes destructive interference between reflected electron probability waves (De Broglie waves). Another technical advantage of the present invention is that it allows for an increase in particle emission through a potential energy barrier. Another technical advantage of the present invention is that a surface has a sharply defined geometric pattern of a dimension that promotes destructive interference of the reflected elementary particle probability waves.

A controllable increase in the Fermi level, and the corresponding decrease of the work function of the metal will have practical use for devices working on the basis of electron motion, electron emission, electron tunneling etc.

BRIEF DESCRIPTION OF DRAWINGS

For a more complete understanding of the present invention and the technical advantages thereof, reference is made to the following description taken with the accompanying drawings, in which.

BEST MODE FOR CARRYING OUT THE INVENTION

The embodiments of the present invention and its technical advantages are best understood by referring to FIGS. 2–14.

Figure 2:
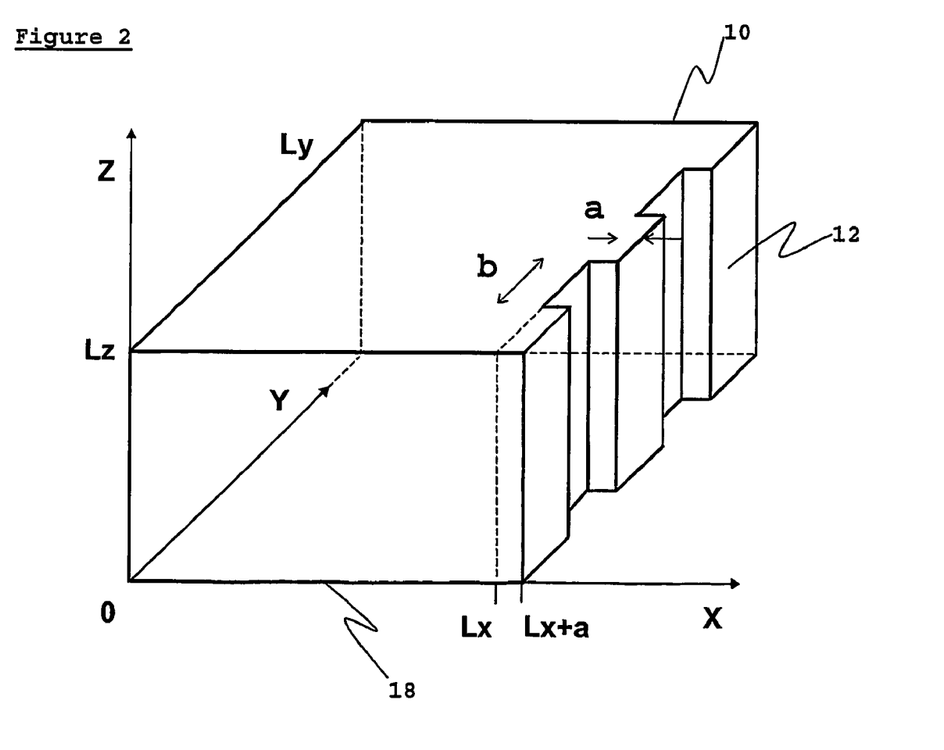
FIG. 2 is a diagrammatic representation of a three-dimensional potential energy box with indented wall. a is the depth of the indent and b is width of the indent. Potential energy is zero everywhere inside the box volume and is infinity everywhere outside of box volume. Maximum dimension in X direction is $L_x+a$.

Referring now to FIG. 2, which shows a modified potential energy box (MPEB) 10, five walls of the potential energy box are plane and the sixth wall 12 is indented. The indents on the sixth wall 12 have the shape of strips having depth of a and width of b. The length of the box in the X direction Lx+a, in the Y direction is Ly and in the Z direction is Lz. The potential energy of a particle inside the box volume is equal to zero, and outside the box volume is equal to U. There is a potential energy jump from zero to U at any point on the walls of the box.

Figure 3:
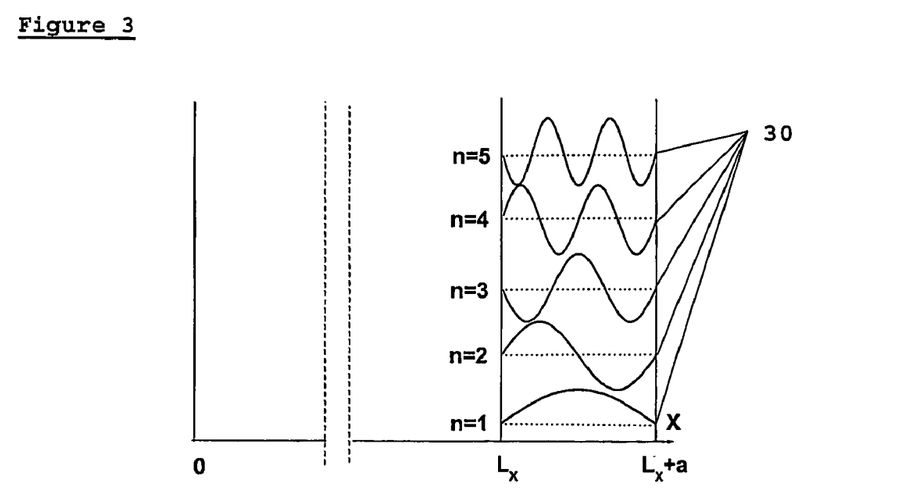
FIG. 3 is a diagrammatic representation of a potential energy box together with solutions of Schroedinger equation. Boundary conditions $\psi(L_x)=0$ and $\psi(L_x+a)=0$ define solutions of Schroedinger equations as shown on the right side of the figure.

Referring now to FIG. 3, which shows the further boundary conditions that are introduced as a result of the modification of wall 12, the wave function should now be equal to zero not only at x=0 and x=$L_x$+a, but also at the point x=$L_x$. Yet another additional boundary condition is added because the modified wall could be divided into two parts with equal area. The first part is situated at distance $L_x$ from the opposite wall, while the second part is situated at distance $L_x$+a from the opposite wall. Once U=∞ is true for every point of both parts of the modified wall, $\psi$=0 is true also for every point of both parts of the modified wall. This means that $\psi(L_x)$=0 and $\psi(L_x+a)$=0. In addition, there is the boundary condition for the unmodified wall, $\psi(0)$=0. Thus three boundary conditions in the X direction:

$$\psi(0)=0, \psi(L_x)=0 \text{ and } \psi(L_x+a)=0 \quad (6)$$

There is no general solution of (1) which will be true for any pair of $L_x$ and a, unlike the case of OPEB in which has solutions for any L. However, it is obvious that the last two boundary conditions of equation (6) define possible solutions, just as they do for the OPEB of width of L=a. The wave function should be zero at points $L_x$ and $L_x$+a, and possible solutions are sinusoids 30 having a discrete number of half periods equal to a, as shown in FIG. 3.

The first boundary condition from (6) will be automatically satisfied together with the last two boundary conditions only in the case that $$L_x=pa \quad (7)$$

where p=1, 2, 3, . . . There will be some solutions also for the case $L_x \neq pa$. For example in the case $L_x$=pa/2 there are solutions satisfying all three boundary conditions for n=2, 4, 6, . . . It is obvious that number of solutions satisfying all boundary conditions (6) will be maximum in the case Lx=pa, and so in the following it is assumed that $L_x$=pa, which maximizes the possible solutions.

Assuming then that MPEB has dimensions satisfying condition (7), solutions will be $$k_n=n\pi/a \quad (8)$$

just as for the OPEB (5) of width L=a. However, the whole width of the box is replaced by a part of it ($L_x$+a is replaced by a). It is interesting to compare solutions for MPEB (8) and OPEB of width of L=$L_x$+a (in this one dimensional case). Solutions for OPEB having width of L=$L_x$+a will be $$k_n=n\pi/(L_x+a) \quad (9)$$

and the solution for the MPEB will be (8). There are thus fewer possible values for k in the case of the MPEB compared to an OPEB of the same width. Thus modifying the wall of the potential energy box as shown in FIG. 2 leads to a decrease in the number of possible quantum states. More precisely, altering the potential energy box leads to a decrease in the number of possible wave vectors per unit length on k line $(L_x+a)/a$ times. This last equation is easily obtained from (8) and (9).

Applying a three-dimensional analysis, if $a \ll L_x, L_y, L_z$ it will not influence the solutions of Schroedinger equation for both Y and Z dimensions appreciably, and $k_x=n(\pi/a)$, $ky=n(\pi/L_y)$, $k_z=n(\pi/L_z)$, and the volume of elementary cell in k space will be $$V_m=\pi^3/(aL_yL_z) \quad (10)$$

which is again $(L_x+a)/a$ times more than the volume of the elementary cell in k space for the OPEB, where $V_m=\pi^3/[(L_x+a)L_yL_z]$. Volume in k space for three-dimensional case changes like linear dimension on k line in the one-dimensional case. Because of that results can be easily extrapolate from the one-dimensional case to the three-dimensional case.

The importance of this is illustrated by the following thought experiment in which there are two potential energy boxes of the same dimensions, one an OPEB with all walls plane, and another a MPEB with one wall modified. An equal number of fermions are placed, one at a time, in both of the potential energy boxes and the wave vector and energy of the most recently added fermion in both boxes is observed. The first fermion in both boxes will occupy quantum state $k_0=0$ in ordinary box and $k_{m0}=0$ in MPEB. The second fermion in OPEB will occupy $k_1=\pi/(L_x+a)$ and in MPEB $k_{m1}=\pi/a$. If equal number of fermions are continued to be added to both boxes, then $k_n=n\pi/(L_x+a)$ for the OPEB and $k_{mn}=n\pi/a$ for the MPEB. It is obvious that the $n^{th}$ fermion will have $(L_x+a)/a$ times more wave vector in the MPEB than in the OPEB. Correspondingly, the energy of the $n^{th}$ fermion in the MPEB will be $[(L_x+a)/a]^2$ times higher than in the OPEB. This is only true for the one-dimensional case. For the three-dimensional case, the ratio of energies of the $n^{th}$ pair of fermions will be $$(E_m/E)=[(L_x+a)/a]^{2/3} \quad (11)$$

here $E_m$ is the energy of $n^{th}$ fermion in the MPEB and E is the energy of the $n^{th}$ fermion in the OPEB. Index n is skipped in formula (11) because the ratio of energies does not depend on it.

Free electrons inside the solid statelis one of the examples of fermions inside the potential energy box. For metals, the theory of electron gas inside the lattice is well developed and is based on different models, the most simple of which is the quantum model of free electrons, which gives excellent results when applied to most metals. It is well known that free electrons in metal form a Fermi gas. Boundary condition $\psi=0$ outside the metal is used in all theories because in metals the potential energy barrier is high enough to allow that simple approximation. In the quantum theory of free electrons, cyclic boundary conditions of Born-Carman $$k_x=2\pi n/L \quad (12)$$

are used instead of (5). Here n=0, ±1, ±2, ±3, . . . Cyclic boundary conditions leave the density of quantum states unchanged, and at the same time they allow the study running waves instead of standing waves, which is useful for physical interpretation. The result of the theory is Fermi sphere in k space. All quantum states are occupied until $k_F$ at T=0 K. $k_F$ is maximum wave vector inside the metal at T=0 K because states with $k>k_F$ are empty.

For a MPEB, the distance between quantum states in k space in $k_x$ direction will become $2\pi/a$ instead of $2\pi/(L_x+a)$. The number of quantum states per unit volume in k space will decrease $(L_x+a)/a$ times. Metal retains its electrical neutrality, which means that the same number of free electrons have to occupy separate quantum states inside the metal. Because the number of quantum states per unit volume in k space is less than in the case of ordinary metal, some electrons will have to occupy quantum states with $k>k_F$. This shows that the Fermi wave vector and the corresponding Fermi energy level will increase.

The maximum wave vector $k_m$ at T=0 K for metal with a modified wall can be calculated. Posit that the lattice is cubic, the metal is single valence, and the distance between atoms is d. The volume of metal box shown in FIG. 2 is $$V=L_yL_z(L_x+a/2) \quad (13)$$

Number of atoms inside the metal is $q=V/d^3$. The number of free electrons is equal to q which gives:

$$q=L_yL_z(L_x+a/2)/d^3 \quad (14)$$

for the number of free electrons. The volume of elementary cell in k space is $$Ve=(2\pi/a)(2\pi/L_y)(2\pi/L_z) \quad (15)$$

And the volume of the sphere of the radius of $k_m$ in k space is $$V_m=(4/3)\pi k_m^3 \quad (16)$$

here $k_m$ is maximum possible k in the case of modified wall and $V_m$ is the volume of modified Fermi sphere in k space. Number of possible $k=k_x+k_y+k_z$ in k space is $V_m/V_e$. Each k contains two quantum states occupied by two electrons with spins 1/2 and −1/2. Using (14), (15), (16) gives $$(q/2)=(k_m^3 aL_xL_z/6\pi^2) \quad (17)$$

and for the radius of modified Fermi sphere $$k_m=(1/d)[3\pi^2(L_x/a+1/2)]^{1/3} \quad (18)$$

It is well known that the radius of a Fermi sphere $k_F$ for an ordinary metal does not depends on its dimensions and is $k_F=(1/d)(3\pi^2)^{1/3}$. Comparing the last with (18) gives $$k_m=k_F(L_x/a+1/2)^{1/3} \quad (19)$$

Formula (19) shows the increase of the radius of the Fermi sphere in the case of metal with modified wall in comparison with the same metal with plane wall. If it is assumed that $a \ll L_x, L_y, L_z$ formula (19) could be rewritten in the following simple form:

$$k_m=k_F(L_x/a)^{1/3} \quad (20)$$

According to (3) the Fermi energy in the metal with the modified wall will relate to the Fermi energy in the same metal with the plane wall as follows:

$$E_m=E_F(L_x/a)^{2/3} \quad (21)$$

Thus it is shown that modifying the geometry of the metal wall results in an increase of the Fermi level in the metal.

It is interesting to consider what would happen if the ratio $L_x/a$ is made high enough for $E_m$ to exceed vacuum level. Assuming that some electrons have energies greater than the vacuum level, they will leave metal. The metal, as a result, will charge positively, and the bottom of the potential energy box will go down on the energy scale, because metal is charged now and it attracts electrons. Once the bottom of the potential energy box decreases, vacant places for electrons will appear at the top region of potential energy box. Electrons left the metal will return back because of electrostatic force and occupy the free energy states. Accordingly, $E_m$ will not exceed the vacuum level. Instead, the bottom of the potential energy box will go down exactly at such distance to allow the potential energy box to carry all electrons needed for electrical neutrality of the metal. Regarding the work function it is clear that increasing the ratio of $L_x/a$ will decrease first until it gets equal to zero. Even with a further increase in $L_x/a$, the work function will remain zero. In real metals surfaces are never ideally plane. Roughness of the surface limits the increase of Fermi level.

It is useful to recall here that analysis was made within the limits of quantum theory of free electrons. Model of free electrons give excellent results for single valence metals. More developed theories, which take into account electron-lattice and electron-electron interaction could be used to obtain more precise results. However results given here will remain valid within all theories at least for the region $(-\pi/d)<k<(\pi/d)$, where d is lattice constant. Dimensional effects in semiconductor and semimetals were studied theoretically [V. A. Volkov and T. N. Pisker "Quantum effect of dimensions in the films of decreasing thickness" Solid State Physics (Russian), 13, p. 1360 (1971); V. N. Lutskii. JETP Letters (USSR) 2, p. 245 (1965)]. Particularly influence of thin film dimensions on its Fermi level, is studied in [V. N. Lutskii. JETP Letters (USSR) 2, p. 245 (1965)].

Figure 4:
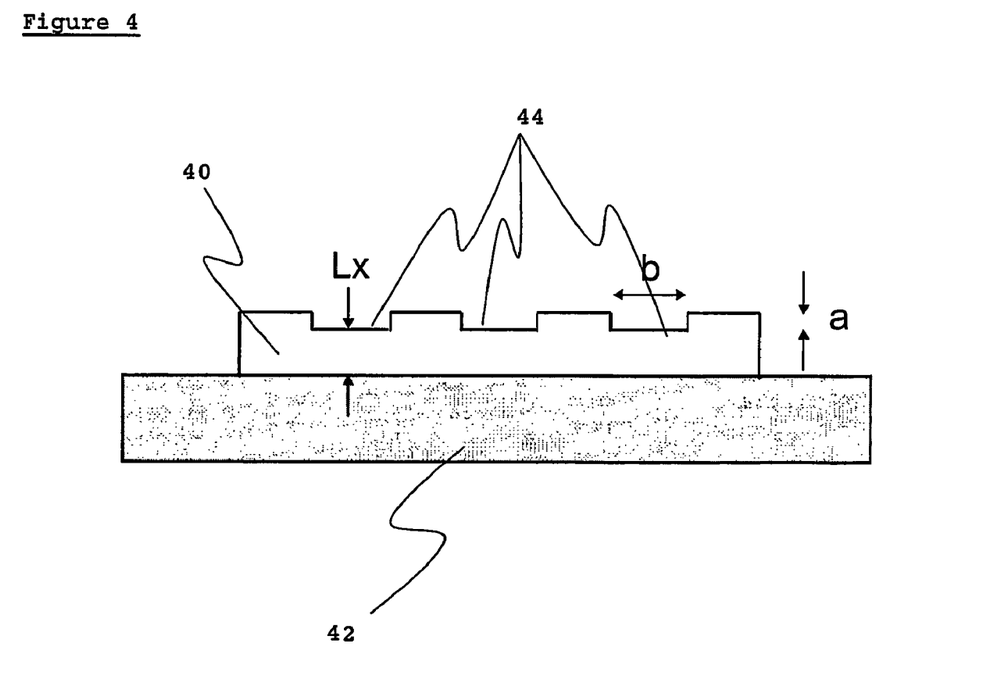
FIG. 4 is a diagrammatic representation of a possible realization of metal with indented wall. Indents are etched on the surface of thin metal film deposited on insulating substrate.

Referring now to FIG. 4, which shows a structure that satisfies the requirements given above, a thin metal film 40 is deposited on the insulator substrate 42, and indents 44 are etched into the film. Indents have depth a and width b.

Most metals oxidize under the influence of atmosphere. Even when placed in vacuum metals oxidize with time because of influence of residual gases. Typical oxides have depth of 50–100 Å, which is considerable on the scale discussed. In one embodiment, film 40 comprises an oxidation-resistant metal. In a preferred embodiment, film 40 comprises gold.

In one embodiment, film 40 is deposited so that it is homogenous and not granular: if the metallic film is granular, the wave function will have an interruption on the border of two grains, and the indented wall's influence on the boundary conditions will be compromised because the wave function will not be continuous on the whole length of $L_x+a$. In a preferred embodiment, film 40 is a monocrystal. It is necessary to note here that lattice impurities do not influence free electrons with energies $E<E_F$. In order to interact with an impurity inside the lattice, the electron should exchange the energy with the impurity in the lattice. That type of energy exchange is forbidden because all quantum states nearby are already occupied. The mean free path of an electron, sitting deep in Fermi sea is formally infinite. So the material of the film can have impurities, but it should not be granular. That type of requirement is quite easy to satisfy for thin metal films.

Figure 5:
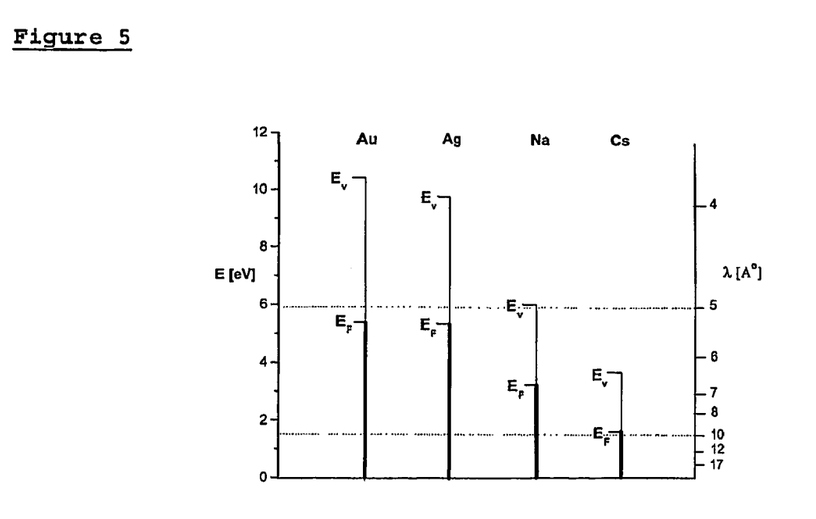
FIG. 5 is an Energy diagrams of some single valence metals on the scale of de Broglie wavelength calculated as $\lambda=2\pi/k$ from (3).

In a preferred embodiment, film 40 is plane. The surface of the film should be as plane as possible, as surface roughness leads to the scattering of de Broglie waves. Scattering is considerable for the wavelengths of the order or less than the roughness of the surface. Substrates with a roughness of 5 Å are commercially available. Metal film deposited on such substrate can also have a surface with the same roughness. The de Broglie wavelength of a free electron in metal sitting on the Fermi level is approximately 10 Å. Scattering of the de Broglie wave of electrons having energies $E>E_F$ will be considerable. Consequently, energy states with energies $E>E_F$ will be smoothed. Smoothing of energy levels decrease the lifetime of the energy state and lead to continuous energy spectrum instead of discrete one. FIG. 5 shows a comparison of Fermi and vacuum levels of some single valence metals on the energy scale and simultaneously on the scale of de Broglie wavelength of the electron calculated from formula (3). It is evident that 5 Å roughness of the surface is enough to eliminate energy barrier (in the case $L_x \neq pa$) for such metals as Cs and Na. The same roughness creates gap from zero to approximately Fermi level in energy spectrum of such metals as Au and Ag.

Values for a and b are chosen to reduce diffraction of the standing wave (see formulas (2) and (4) that show that plane waves are solutions of the Schroedinger equation). A standing wave comprises two plane waves moving in the direction of X and –X. Wave diffraction will take place on the indent. Diffraction on the indents will lead to the wave "ignoring" the indent, which changes all calculations above. In a preferred embodiment values for a and b are chosen so that the diffraction of the wave on the indent is negligible, or $$b >> \lambda_1 \qquad (22)$$

Here $\lambda_1 = 2\pi/k_1$ is de Broglie wavelength of electron with wave vector $k_1$ (n=1 in FIG. 3). It is obvious that (22) will be automatically valid for n=1, 2, 3, ...

The thickness of film 40 is chosen so that equation (7) is valid. In one embodiment, $L_x$ is a multiple of a. If equation (7) is not valid, then the number of quantum states will be less than the number given by formula (8). Decreasing the number of quantum states will magnify the effect of increasing of $E_F$, but it will be problematic to control work function decrease without keeping (7) valid during the metal film deposition stage, as well as during indent etching. In addition, if (7) is deliberately kept not valid it will lead to the elimination of possible quantum states from E=0 to energy level defined by roughness of the surface. In a further embodiment $L_x$ is chosen so that it is not a multiple of a.

In a preferred embodiment depth of the indent should be much more than the surface roughness. Consequently, the minimum possible a is 30–50 Å. Preferably the indents have a depth of a depth approximately 5 to 20 times the surface roughness. According to (22) the minimum possible b will be 300–500 Å. Preferably the width is approximately 5 to 15 times the depth. These dimensions are well within the capabilities of e-beam lithography and ion beam milling. The primary experimental limitation in the case of the structure shown on FIG. 4 is that the ratio $(L_x/a) \geq 5$, in order to achieve a work function which is close to zero. Consequently, the thickness of the metal film should be at least 180–300 Å, and is preferably 150 to 750 Å. Usually films of such thickness still repeat the substrate surface shape, and the film surface roughness does not exceed the roughness of the base substrate. However, the same is not true for metal films with a thickness of 1000 Å and more, because a thick film surface does not follow the surface of the substrate. That puts another limit $15 \geq (L_x/a) \geq 5$ on the dimensions of the structure, when metal films are deposited on the substrates. Other possible solutions, such as metal crystals of macroscopic dimensions like those frequently used for electron beam microscope cathodes, will not be limited by the same requirements.

Figure 6:
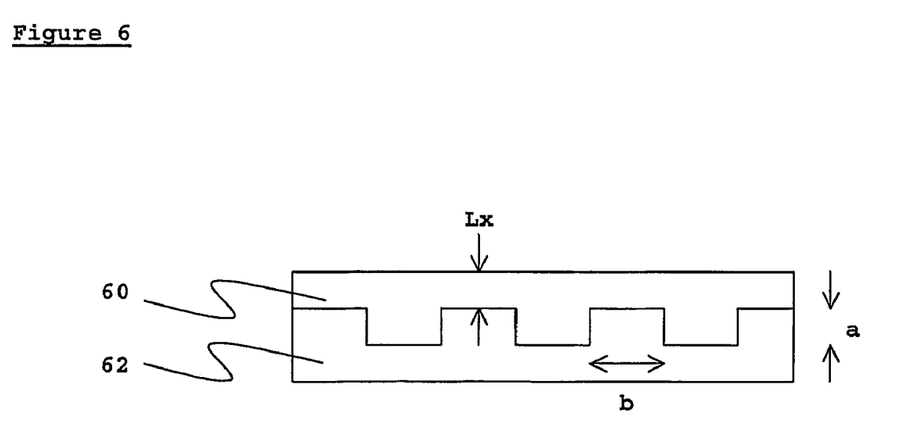
FIG. 6 is a diagrammatic representation of a possible realization of metal with indented wall. Indents are etched on the surface of an insulating substrate, on which is deposited a thin metal film.

Referring now to FIG. 6, which shows a further embodiment of a structure that satisfies the requirements given above, a thin metal film 60 is deposited on a structured insulator substrate 62. The structured substrate as indentations of depth a and the distance between the indents is b. This means that the metal film has thickness $L_x$ and has indents of depth a and width b, but now the active surface is plane.

Figure 7:
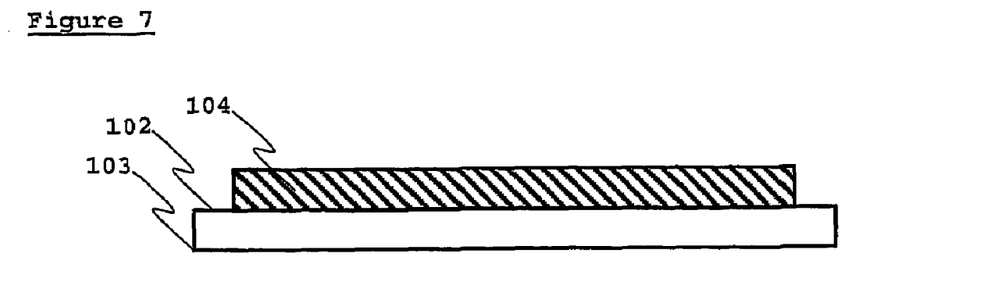
FIG. 7 depicts a surface and a layer in accordance with an embodiment of the present invention.

A particularly preferred approach for fabricating a structure that satisfies the requirements given above is shown in diagrammatic form in FIG. 7, which depicts a surface 102 of a material 103 and a metal layer 104 in accordance with one embodiment of the present invention. Material 103 may be comprised of a variety of substances, and may be metallic or a semiconductor. In one embodiment material 103 is resistant to etching in any direction except the direction perpendicular to the surface 102. In a further embodiment, surface 102 is able to emit electrons via thermionic, secondary, photoelectric and/or field emission. In a yet further embodiment, surface 102 is comprised of silicon. Layer 104 comprises a material that is different to material 103, and is relatively more sensitive to e-beam or ion beam or more readily ablated than material 103. Preferably, layer 104 does not promote a chemical reaction with surface but is adsorbed to the surface. In a preferred embodiment, layer 104 comprises soft metals such as lead, tin or gold. Layer 104 is deposited on surface 102 such that layer 104 is in adhesive contact with surface 102. Layer 104 covers surface 102 in a uniform manner such that surface 102 is protected from the environment. Preferably layer 104 is a thin film having a depth of 20 to 200 Ångstroms. Preferably surface 102 is substantially flat, but layer 104 may be also deposited after milling on surface 102.

Figure 8:
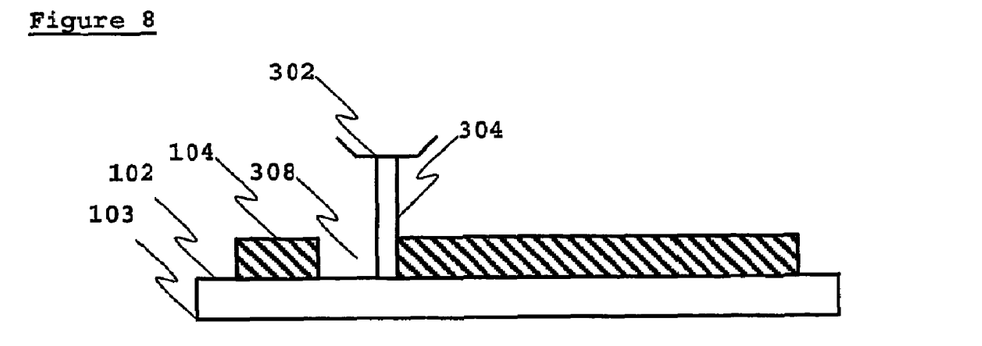
FIG. 8 depicts an exposure of a layer to an energy source in accordance with an embodiment of the present invention.

Referring now to FIG. 8, which depicts exposure of selected areas of layer 104 to an e-beam source 302, e-beam 304 operates at a low intensity and cuts the ablatable material of layer 104. Ion beam or beam of other particles could be used instead of e-beam. Preferably, the source positions the beam at the center of a hole 308 within layer 104. Hole 308 represents that part of layer 104 that has been removed by the beam. Because no beam is focused ideally layer 104 is being removed more in the center and less on the periphery of the beam.

Because material 103 is much harder than material 104, the central area of 308 is minimally damaged by the beam in the time period starting after finishing milling of 104 in the center of 308 and before finishing the milling of 104 on the periphery of 308.

Figure 9:
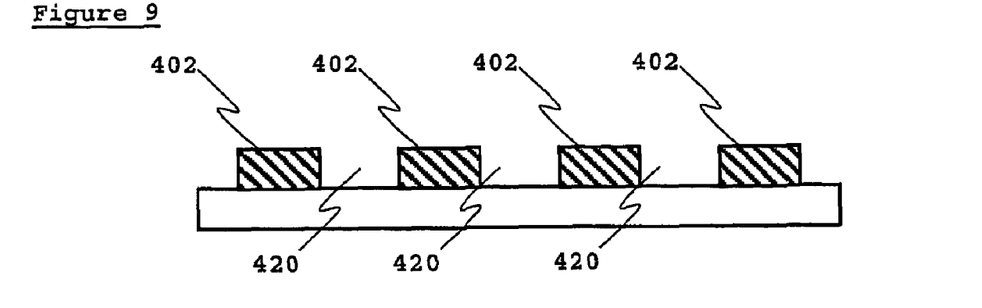
FIG. 9 depicts a geometric pattern and a layer on a surface in accordance with an embodiment of the present invention.

Referring now to FIG. 9, which depicts a geometric shape in layer 104 on surface 102 in accordance with an embodiment of the present invention, the beam repeats the process of cutting holes into layer 104 shown in FIG. 2, to create the geometric shape in the material 103 as shown. The geometric shape includes strips 402, which are the remaining material of layer 104. These preferably comprise lead, tin, or gold. Most preferably, strips 402 comprise gold. Geometric shape 420 has edges enclosed by strips 402. Alternatively, the beam can produce other geometric shapes in the layer 104, such as squares, rectangles, a single strip, or a stepped shape.

Figure 10:
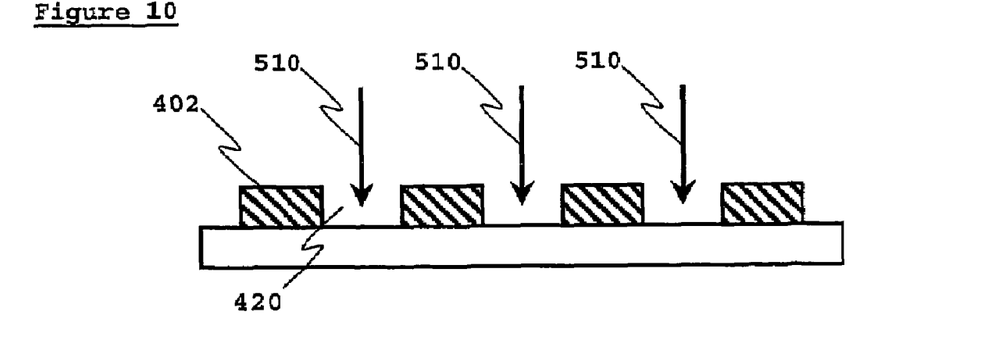
FIG. 10 depicts etching a surface in accordance with an embodiment of the present invention.

Referring now to FIG. 10, which depicts the etching surface 102 in accordance with an embodiment of the present invention, etchant 510 reacts with surface 102, but not with strips 402 nor with the portion of the surface 102 that is covered with strips 402. The etchant etches surface 102 in a precise and uniform manner. The etchant may be a chemical that reacts with surface 102, or it may be a plasma. Preferably, etchant 510 is a liquid.

Figure 11:
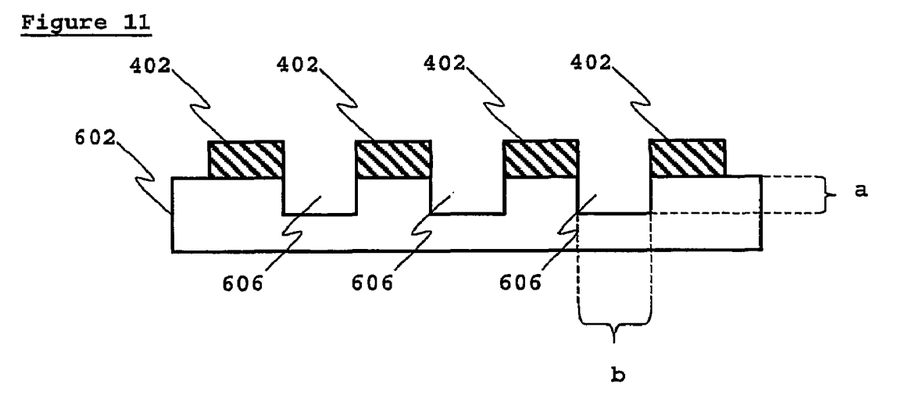
FIG. 11 depicts an etched geometric pattern in a surface in accordance with an embodiment of the present invention.

Referring now to FIG. 11, which depicts an etched geometric pattern in accordance with an embodiment of the present invention, indents 606 are created by the reaction of etchant 510 with surface 102 as described above to yield surface 602 having the geometric pattern etched into its surface. The depths a of indents 606 are controlled by the application of etchant 510. Strips 402 reside on top of the non-indented regions within geometric pattern surface 602. The indents created by etchant 510 correlate with geometric shapes 420 cut by beam 304 as described above.

Figure 12:
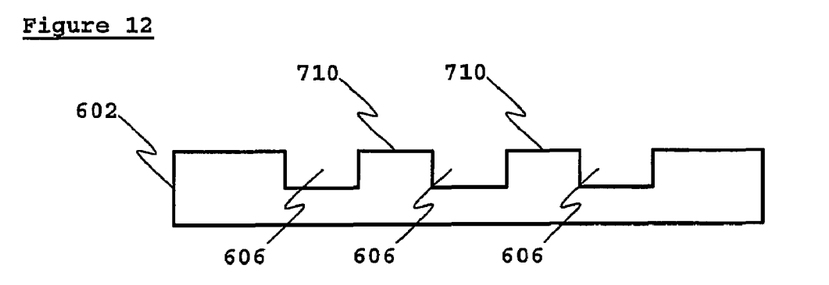
FIG. 12 depicts a wave interference barrier in a surface in accordance with an embodiment of the present invention.

Referring now to FIG. 12, which depicts a wave interference surface in accordance with an embodiment of the present invention, strips 402 are removed from geometric pattern surface 602 to expose non-indented regions 710. Strips 402 may be removed by vacuum evaporation or other removal techniques that do not damage the underlying surface. Protrusions 710 are the raised surfaces of geometric pattern surface 602. Thus, geometric pattern surface 602 has a distinct geometric pattern formed by indents 606 and protrusions 710. Geometric pattern surface 602 includes spaced indents 606 and protrusions 710. The depth of the indents and the width of the protrusions are about equal across geometric pattern surface 602. The magnitude of defined depth a of indent 606 and it's associated width b are discussed above.

Figure 13:
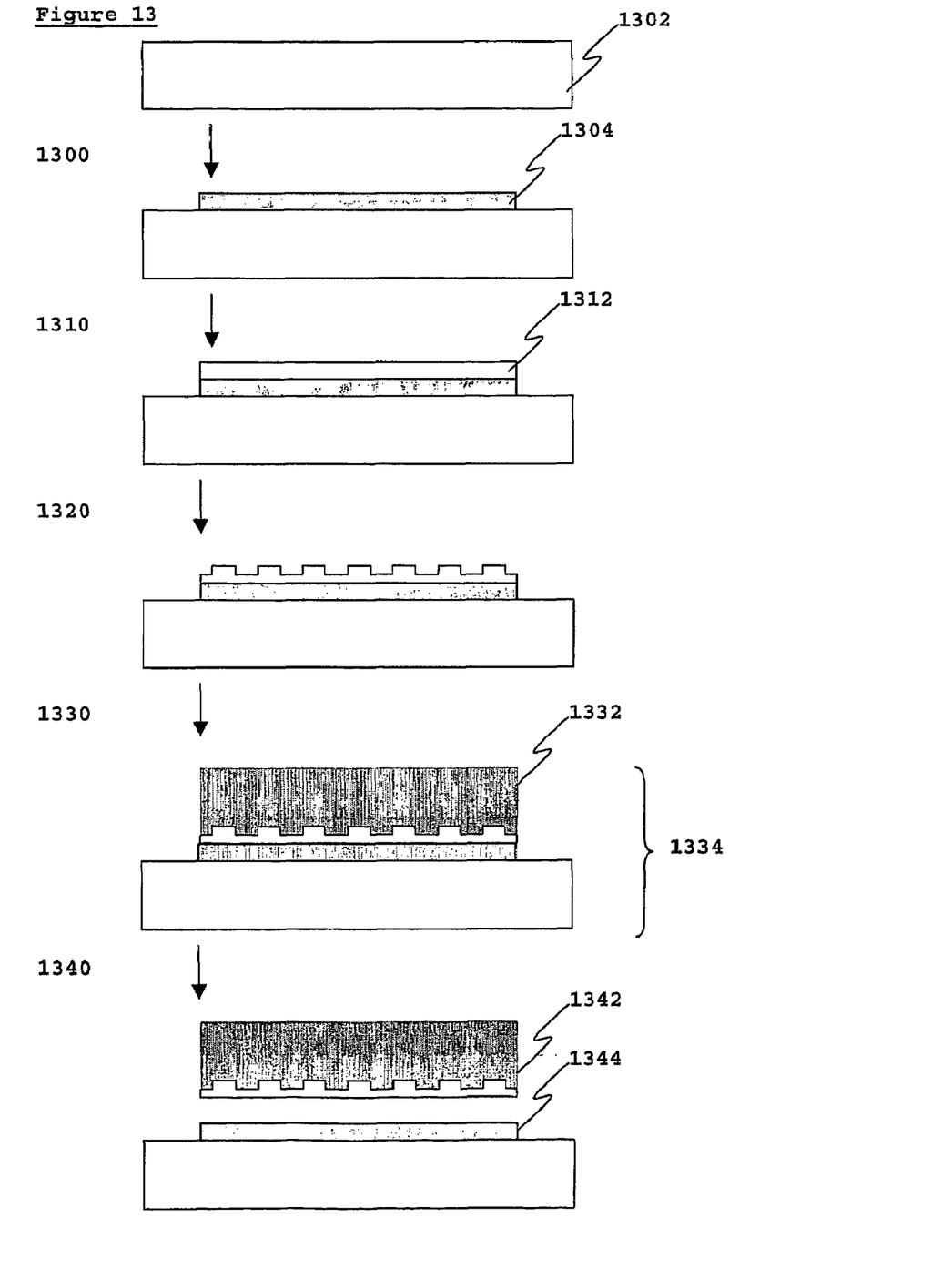
FIG. 13 depicts a process for making paired electrodes.

A further approach, useful for making the device shown in FIG. 6, is shown diagrammatically in FIG. 13. Here, in step 1300, a layer of titanium 1304 is deposited on a wafer 1302. The wafer may comprise silicon or molybdenum.

Next, in step 1310, a layer of silver 1312 is deposited on the layer of titanium. The next step, step 1320, involves the formation of an indented surface in the silver layer, which may be achieved as described above, particularly as shown in FIGS. 7 to 12. In step 1330 a layer of copper 1332 is grown electrochemically on the layer of silver to form composite 1334, which is an electrode pair precursor. In step 1340, composite 1334 is heated, which causes it to open as shown, forming a pair of matching electrodes, 1342 and 1344.

Figure 14:
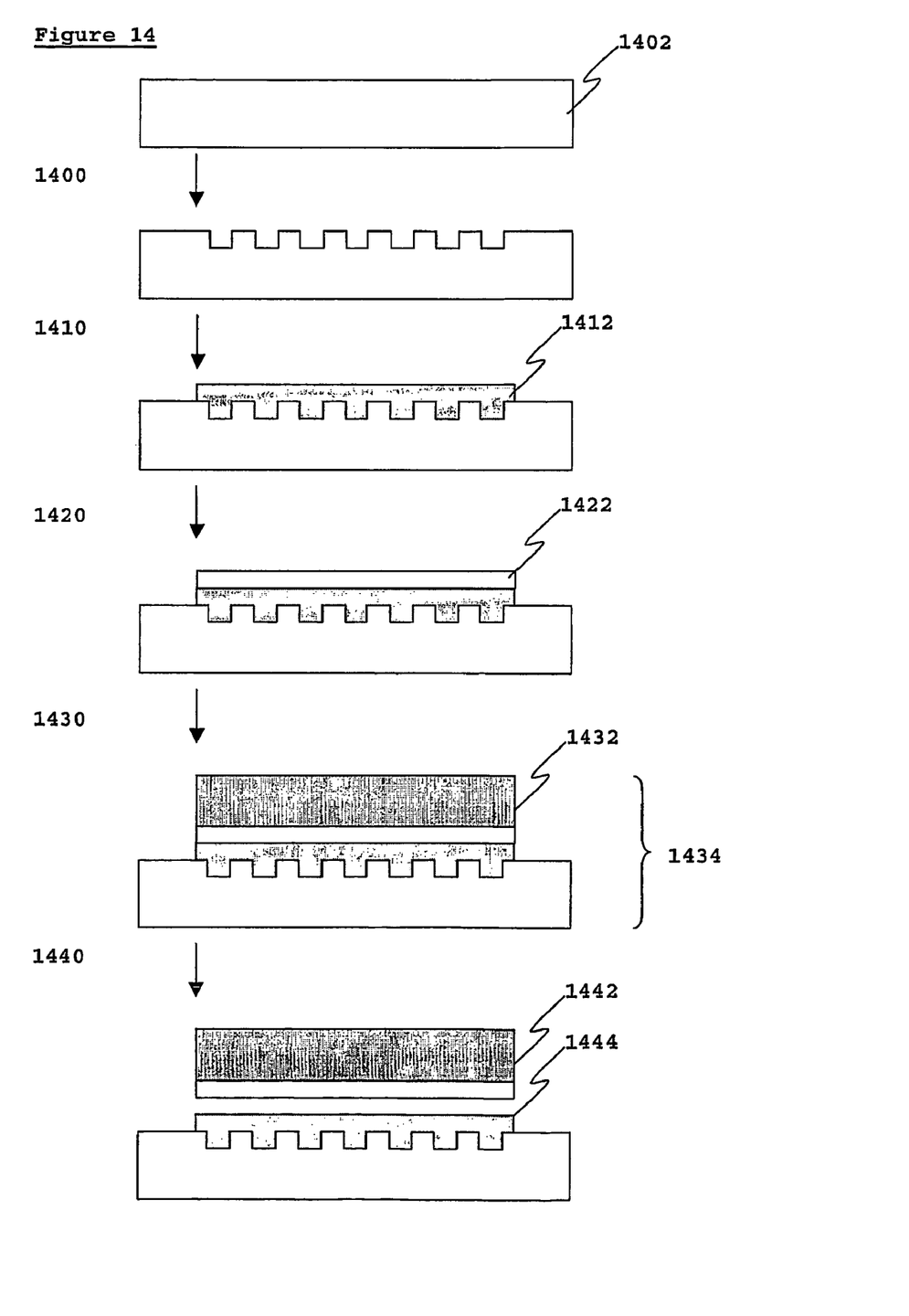
FIG. 14 depicts a process for making paired electrodes.

An alternative approach for forming matched electrodes, one of which has the properties associated with an indented structure, is shown in FIG. 14. Here in step 1400 an indented surface is formed on the wafer 1402. The indented surface may be formed as described above, particularly as shown in FIGS. 7 to 12. Next, in step 1410, a layer of silver is deposited on the indented wafer 1402, and in a further step 1420, a layer of titanium 1422 is deposited is on the silver layer. In step 1430 a layer of copper 1432 is grown electrochemically on the layer of silver to form composite 1434, which is an electrode pair precursor. In step 1440, composite 1434 formed is heated, which causes it to open as shown, forming a pair of matching electrodes, 1442 and 1444.

Figure 15:
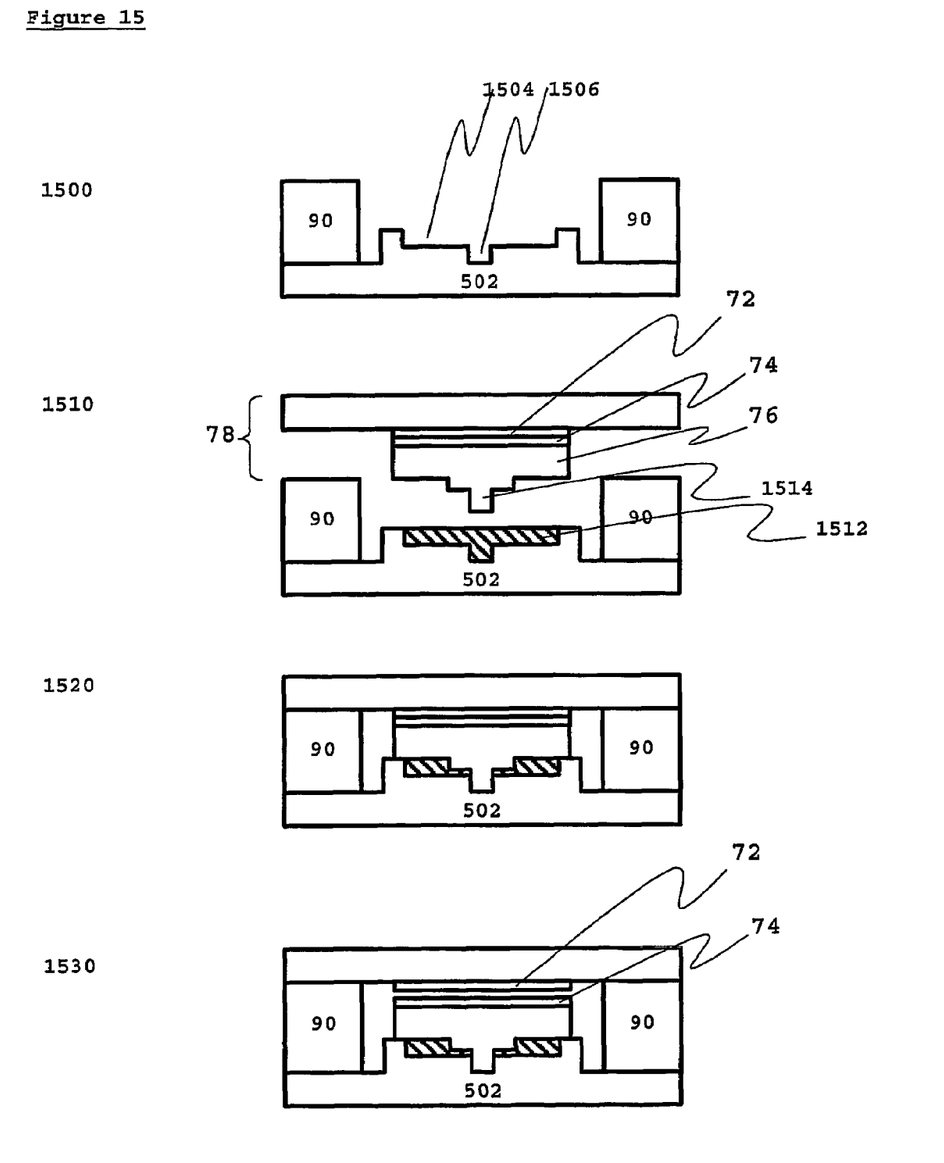
FIG. 15 depicts a process for making a diode device.

The electrode pairs made in steps 1340 and 1440 may be utilized to make diode devices, and a preferred process is depicted in FIG. 15, where in step 1500 a first substrate 1502 is brought into contact with a polished end of a quartz tube 90. Substrate 1502 is any material which may be bonded to quartz, and which has a similar thermal expansion coefficient to quartz. Preferably substrate 1502 is molybdenum, or silicon doped to render at least a portion of it electrically conductive. Substrate 1502 has a depression 1504 across part of its surface. Substrate 1502 also has a locating hole 1506 in its surface.

In step 1510, liquid metal 1512, is introduced into depression 1502. The liquid metal is a metal having a high temperature of vaporization, and which is liquid under the conditions of operation of the device. The high temperature of vaporization ensures that the vapor from the liquid does not degrade the vacuum within the finished device. Preferably the liquid metal is a mixture of Indium and Gallium.

Composite 78 is positioned so that alignment pin 1514 is positioned above locating hole 1506. Composite 78 is composite 1334 depicted in FIG. 13, or is composite 1434 depicted in FIG. 14; for simplicity, the indented interface is not shown. Alignment pin 1514, which is pre-machined, is placed on the composite near the end of the electrolytic growth phase; this results in its attachment to the layer of copper 1332 or 1432. The diameter of the alignment pin is the same as the diameter of the locating hole.

In step 1520, the polished silicon periphery of the composite 78 is contacted with the other polished end of the quartz tube 90; at the same time, the attachment pin seats in locating hole. During this step, substrate 1502 is heated so that locating hole expands; when the assemblage is subsequently cooled, there is a tight fit between the alignment pin and the locating hole. High pressure is applied to this assemblage, which accelerates the chemical reaction between the polished silicon periphery of the composites and the polished ends of the quartz tube, bonding the polished surfaces to form the assemblage depicted in step 1520.

In step 1530, the assemblage is heated, and a signal applied to the quartz tube to cause the composite to open as shown, forming two electrodes, 72 and 74. In the deposition process, the adhesion of the silver and titanium is controlled so that when the electrode composite/quartz tube shown in FIG. 15 is heated, the electrode composite opens as shown, forming a pair of matching electrodes, 72 and 74. During the opening process, the tight fit between the alignment pin and the locating hole ensures that the electrodes 72 and 74 do not slide relative to one another.

The quartz tube has pairs of electrodes disposed on its inner and outer surfaces (not shown) for controlling the dimensions of the tubular element. The crystal orientation of the tube is preferably substantially constant, and may be aligned either parallel to, or perpendicular to the axis of the tube. An electric field may be applied to the tube, which causes it to expand or contract longitudinally. An advantage of such a tubular actuator is that it serves both as actuator and as housing simultaneously. Housing provides mechanical strength together with vacuum sealing. External mechanical shock/vibrations heat the external housing first, and are compensated immediately by actuator.

It has been shown that modifying the wall of a potential energy box changes the boundary conditions for the wave function of an elementary particle inside the potential energy box. New boundary conditions decrease the number of solutions to Schroedinger's equation for a particle inside the MPEB. If the particles are fermions, the decrease in the number of quantum states results in an increase in the energy of the $n^{th}$ particle situated in the potential energy box. General results obtained for fermions in the potential energy box were extrapolated to the particular case of free electrons inside the metal. Calculations were made within the limit of quantum theory of free electrons. It was shown that in the case of a certain geometry of the metal wall, the Fermi level inside the metal will increase. A controllable increase in the Fermi level, and the corresponding decrease of the work function of the metal will have practical use for devices working on the basis of electron motion, electron emission, electron tunneling etc.

Although the above specification contains many specificities, these should not be construed as limiting the scope of the invention but as merely providing illustrations of some of the presently preferred embodiments of this invention.

Indentations and protrusions to a basic surface are both described in the specification, and there is really little technical difference between the two, except in their production method. Where an indented surface is referred to, it should be read as also referring to a surface having protrusions, which, by definition, causes the surface to have an indented cross-section, having indents in the 'spaces' between the protrusions.

INDUSTRIAL APPLICABILITY

The method for enhancing passage of elementary particles through a potential barrier has many applications; for example, the method may be applied to thermionic converters, vacuum diode heat pumps and photoelectric converters, where a reduction in work function gives real benefits in terms of efficiency or operating characteristics.

The elementary particle emitting surface has many further applications. The surface is useful on emitter electrodes and other cathodes because it promotes the emission of electrons. It is also useful on collector electrodes and other anodes because it promotes the passage of electrons into the electrode. The surface also has utility in the field of cold cathodes generally, and electrodes incorporating such a surface can be used.

In the foregoing indents of a required depth and pitch have been described which run across the surface of the slab in a trench-like fashion. Other geometries having indents of the required depth and pitch also fall within the intended scope of the invention. For example, instead of long trenches, these could be checkerboard shape, with the black squares for example, representing surface indentations, and white squares, protrusions. There could be hexagons, octagons or heptagons, or even circles, imprinted into or protruding out of the surface.

The invention claimed is:

1. A material comprising a substantially plane slab of a metal having on one surface one or more indents of a depth approximately 5 to 20 times a roughness of said surface and a width approximately 5 to 15 times said depth.

2. The material of claim 1 in which walls of said indents are substantially perpendicular to one another.

3. The material of claim 1 in which edges of said indents are substantially sharp.

4. The material of claim 1 in which the Fermi energy level of electrons is increased compared to a material comprising a substantially plane slab of the same metal not having on one surface one or more indents.

5. The material of claim 1 wherein said metal comprises an oxidation-resistant metal.

6. The material of claim 1 wherein said metal is substantially homogenous.

7. The material of claim 1 wherein said metal is selected from the group consisting of: lead, tin and gold.

8. The material of claim 1 wherein said metal is substantially free of granular irregularities.

9. The material of claim 1 wherein said metal is a monocrystal.

10. The material of claim 1 wherein said depth $\geq \lambda/2$, wherein $\lambda$ is the de Broglie wavelength.

11. The material of claim 1 wherein said width $>>\lambda$, wherein 1 is the de Broglie wavelength.

12. The material of claim 1 wherein a thickness of said slab is a multiple of said depth.

13. The material of claim 1 wherein a thickness of said slab is not a multiple of said depth.

14. The material of claim 1 wherein a thickness of said slab is between 5 and 15 times said depth.

15. The material of claim 1 wherein a thickness of said slab is in the range 15 to 75 nm.

16. A method of creating on one surface of a substantially plane slab one or more indents of a depth approximately 5 to 20 times a surface roughness of said surface and a width approximately 5 to 15 times said depth, comprising:
   (a) depositing a layer of material on said surface;
   (b) ablating a portion of said layer by means of electromagnetic radiation to expose portions of said surface;
   (c) creating one or more indents at a substantially 90 degree angle to said surface by etching said exposed portions to a uniform depth;
   (d) removing remaining portions of said layer.

17. The method of claim 16 wherein said step of ablating a portion of said layer by means of electromagnetic radiation to expose portions of said surface does not damage said surface.

18. The method of claim 16 wherein said step of ablating a portion of said layer by means of electromagnetic radiation is done with an e-beam.

19. The method of claim 16 wherein said step of ablating a portion of said layer by means of electromagnetic radiation is done with an ion beam.

20. The method of claim 16 wherein said material comprises a metal.

21. The method of claim 20 wherein said metal comprises an oxidation-resistant metal.

22. The method of claim 20 wherein said metal is substantially homogenous.

23. The method of claim 20 wherein said metal is selected from the group consisting of: lead, tin and gold.

24. The method of claim 20 wherein said metal is substantially free of granular irregularities.

25. The method of claim 20 wherein said metal is a monocrystal.

\* \* \* \* \*